United States Patent

Ghomeshi et al.

Patent Number: 5,303,408
Date of Patent: Apr. 12, 1994

[54] SQUELCH DETECTOR

[75] Inventors: Mansour Ghomeshi; Chin P. Wong, both of Ft. Lauderdale; John W. Simmons, Tamarac, all of Fla.

[73] Assignee: Motorola, Inc., Schaumburg, Ill.

[21] Appl. No.: 863,605

[22] Filed: Apr. 3, 1992

[51] Int. Cl.⁵ .............................................. H04B 1/10
[52] U.S. Cl. .................................. 455/222; 455/225; 375/104
[58] Field of Search .............. 455/212, 218, 220, 221, 455/222, 223, 225, 229; 375/102, 103, 104; 381/15, 16

[56] References Cited

U.S. PATENT DOCUMENTS

| | | | |
|---|---|---|---|
| 3,102,236 | 8/1963 | Eichenberger et al. | 455/218 |
| 3,873,926 | 3/1975 | Wright | 455/225 |
| 3,902,123 | 8/1975 | Oomen | 455/221 |
| 4,388,731 | 6/1983 | King | 455/221 |
| 4,477,924 | 10/1984 | Close | 381/15 |
| 4,480,335 | 10/1984 | Kishi | 455/219 |
| 4,783,845 | 11/1988 | McChesney et al. | 375/104 |
| 4,914,715 | 4/1990 | Miyata | 455/221 |
| 4,972,510 | 11/1990 | Guizerix et al. | 375/104 |
| 5,151,922 | 9/1992 | Weiss | 375/104 |

Primary Examiner—Reinhard J. Eisenzopf
Assistant Examiner—Lisa Charouel
Attorney, Agent, or Firm—Mansour M. Ghomeshi

[57] ABSTRACT

A communication device (100) having a receiver (106) and an audio output device (116) is provided. The communication device (100) includes a digital signal processor DSP (110) for measuring the level of signal energy in a first segment of the frequency spectrum of the received signal to dynamically establish a squelch threshold. The DSP (110) is also used to measure the level of signal energy in a second segment of the frequency spectrum of the received signal. The communication device (100) also includes audio gates (114). The audio gates (114) provides for the unmuting of the audio output device (116) when the signal energy contained in the second segment of the frequency spectrum of the received signal is below the squelch threshold.

17 Claims, 5 Drawing Sheets

SQUELCH DETECTOR

TECHNICAL FIELD

This invention is generally related to radio communication devices and more specifically related to squelch circuits in communication devices.

BACKGROUND

Modern radio receivers are typically equipped with a squelch circuit to disable the receiver's audio amplifier after the radio frequency carrier is no longer being received by the radio. The squelch circuit prevents noise from being heard at the receiver's speaker during normal radio operation. The basic purpose of a noise squelch circuit is to detect the change in the discriminator output noise as the received carrier strength changes. As the RF carrier strength increases, the discriminator noise decreases. Because the higher frequency noise falls or "quiets" more rapidly than low or mid-range noise and provides faster response time, it is used in most noise squelch circuits to determine the squelch decision (whether to squelch or unsquelch the receiver).

Typically, a dedicated squelch circuit includes a: noise amplifier stage; preemphasis filter stage; limiter stage; a high pass filter stage; noise squelch rectifier stage; DC amplifier stage; and finally a comparator stage for comparing the received signal with the preset squelch level in the radio which is normally set by the radio user. More advanced squelch circuits include additional circuits for the prevention of fading and other phenomena associated with temporary changes in the RF signal strength. These dedicated squelch circuits are expensive and demand appreciable area to reside on. Despite their high cost and space requirements, these circuits are indispensable mainly due to their significant performance benefits. As the size of communication devices shrinks with the availability of more powerful processors a trend is seen toward the elimination of dedicated components. Squelch detection has resisted this trend and still demands dedicated circuits. A need is therefore felt for a communication device that enjoys the advantages of squelch without a dedicated squelch circuit.

SUMMARY OF THE INVENTION

Briefly, according to the invention, a communication device having a receiver and an audio output device is provided. The communication device includes a first means for measuring the level of signal energy in a first segment of the frequency spectrum of the received signal to dynamically determine a threshold. A second means is also provided to measure the level of signal energy in a second segment of the frequency spectrum of the received signal. The communication device further includes a third means for unmuting the audio output device when the signal level measured by the second means is below the threshold.

In other aspects of the present invention the third means includes means for muting the audio output device when the the signal level measured by the second means is above the threshold.

DETAILED DESCRIPTION OF THE PREFERRED EMBODIMENT

Figure 1:
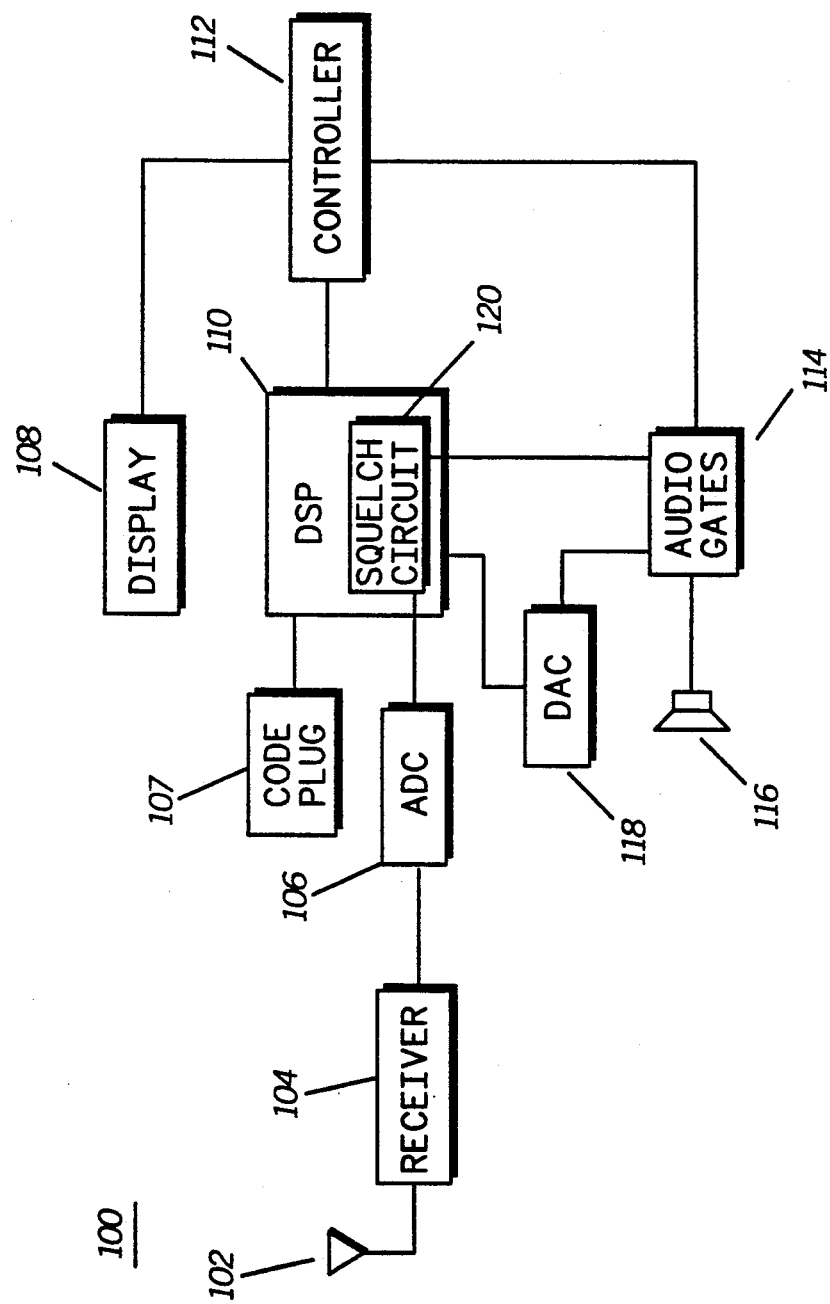
FIG. 1 is a block diagram of a communication device in accordance with the present invention.

Referring to FIG. 1 a block diagram of a communication device 100 in accordance with the present invention is shown. The communication device 100 includes an antenna 102 where radio frequency signals are received and coupled to a receiver 104. Received signals from the receiver 104 are coupled to an Analog to Digital Converter (ADC) 106 where they are converted from analog to digital and presented to a Digital Signal Processor (DSP) 110 where they are further processed. The operation of DSPs is well known in the art. In the preferred embodiment, a DSP 56001 is used to provide the demodulation and decoding of the received signal along with a host of other functions. The DSP 110 includes a squelch circuit 120 which provides the gating control for audio gates 114. The audio gates 114 provide the means for muting and unmuting the audio output device, speaker 116.

As part of its operation, the DSP 110 is in constant communication with a controller 112, which among other things, receives data components of the received signal from the DSP 110 and upon further decoding presents them to the user on a display 108. Voice components, once again from the DSP 110, are coupled to the audio gates 114 via a Digital to Analog Converter (DAC) 118. The DAC 118 converts a digital signal from the DSP 110 to analog and couples it to the audio gates 114. The analog signals are then gated from the audio gates 114 to the speaker 116 under the control of the squelch circuit 120. Note that the identification of the squelch circuit 120 as a separate block in this description is solely intended to facilitate the understanding of the present invention. As will be shown in FIG. 2, the elements of the squelch circuit 120 are very common in DSPS.

Figure 2:
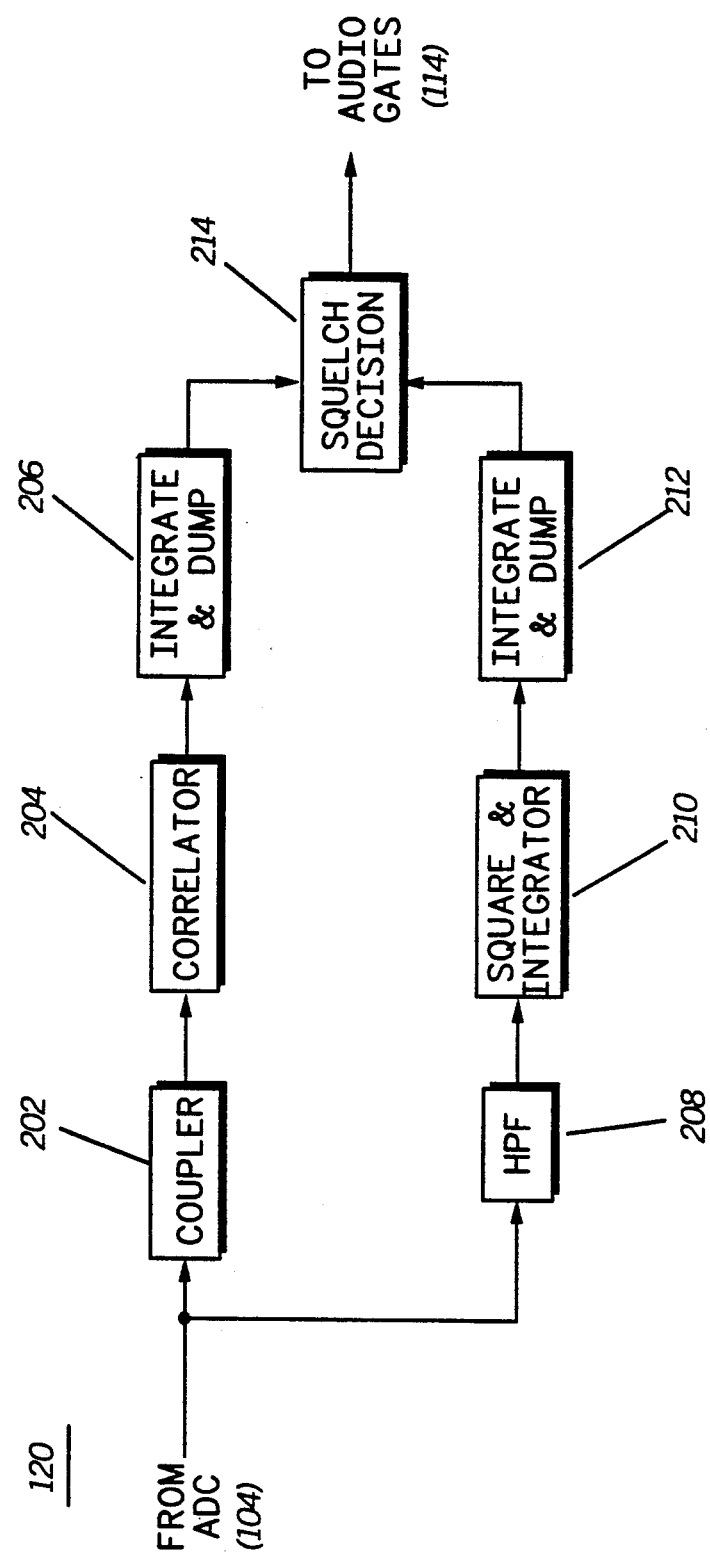
FIG. 2 is a block diagram of a squelch circuit in accordance with the present invention.

Referring now to FIG. 2 a block diagram of the elements of the squelch circuit 120 in accordance with the present invention is shown. A signal from the ADC 106 is coupled to a correlator 204, via a coupler 202 and to a square and integrator 210, via a high pass filter 208. The correlator 204 analyzes a first segment of the frequency spectrum of the received signal, preferably the low band or the audio band, to determine the energy components contained therein. The theoretical output of the correlator 204 can be calculated as follows:

Assuming r(t) is the received signal, n(t) is the noise and s(t) is the actual signal, we have $$r(t) = s(t) + n(t)$$

$$E[r(t)r(t+\tau)] = E[s(t)s(t+\tau) + s(t)n(t+\tau) + s(t+\tau)n(t)n(t+\tau)]$$

Assuming the noise is uncorrelated to both the signal and itself, we have $$E[r(t)r(t+\tau)] = E[s(t)s(t+\tau)]$$

For a tone [A cos ($\omega_c\tau$)], it can be shown that $$E[r(t)r(t+\tau)] = A^2 \cos(2\omega_c t + \omega_c\tau) + A^2 \cos(\omega_c\tau)$$

If the signal is low passed, we will be left with $$A^2 \cos(\omega_c\tau)$$

Assuming $\tau$ is small, the output would be directly proportional to $A^2$, hence the low band energy level. The reason for using a correlator instead of directly integrating the energy of the r(t) is to minimize the noise power's effect on the inband energy estimator.

After the correlation computation of the low band energy, the output of the correlator 204 is used by an integrate and dump circuit 206 to dynamically establish a squelch threshold for the square and integrator 210 to compare the high band energy against. The combination of the correlator 204 and the integrate and dump circuit 206 provide the means for measuring the low band energy content of the received signal. In order to dynamically establish a threshold, the correlator 204 uses the characterization curves 402, 404, 406, and 408, shown in FIG. 4. These curves characterize the performance of the high band energy versus the low band energy for the communication device 100.

Figure 4:
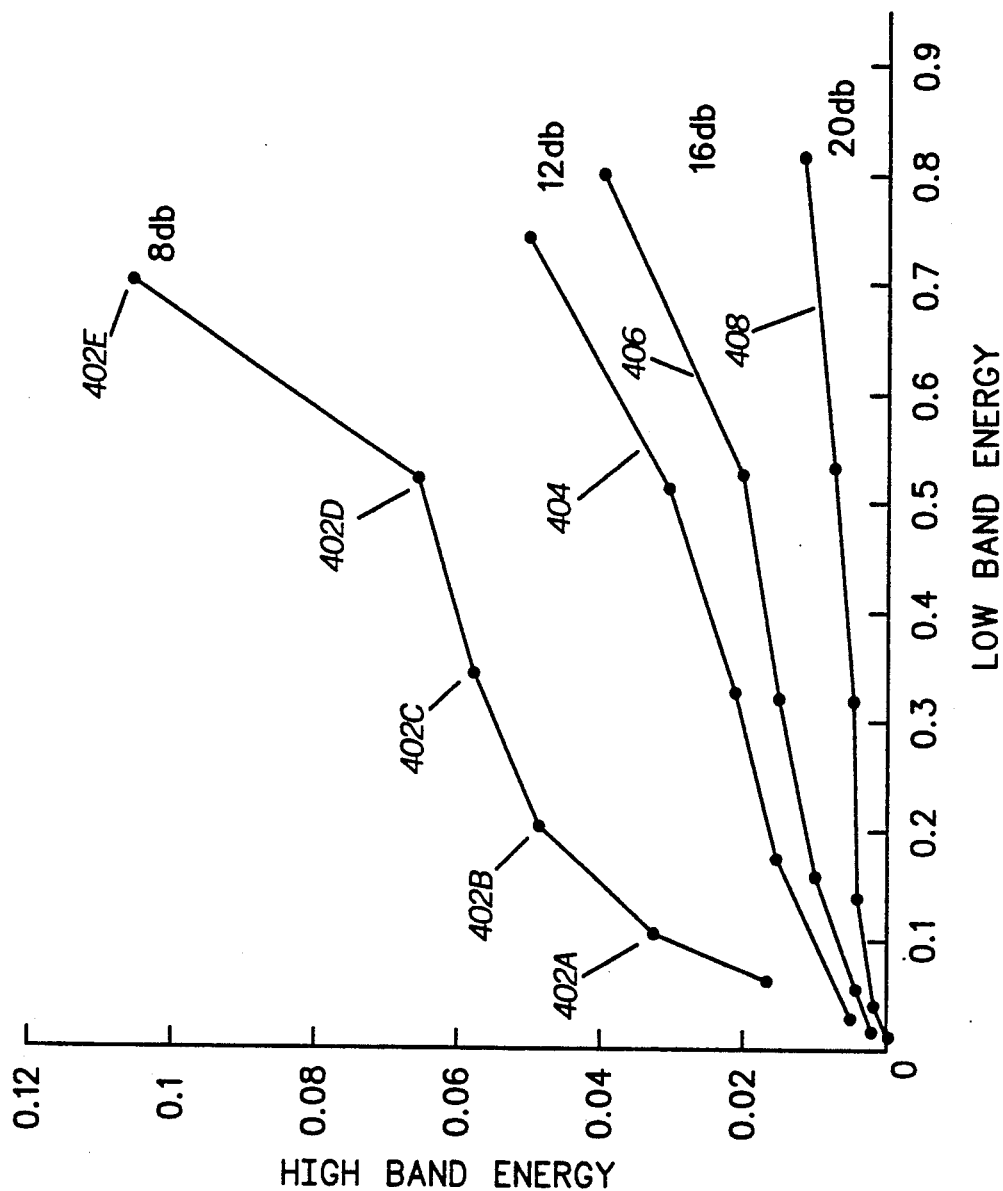
FIG. 4 shows signal to noise ratio performance of a typical radio communication device in accordance with the present invention.

In FIG. 4, the vertical axis represents the normalized highband noise energy. The horizontal axis represents the normalized audio band energy. Several graphs are shown representing the characterization of the low band energy versus the high band noise energy for different signal to noise ratios (SNR) using a reference modulating signal with varying deviation levels. Graph 402 characterizes the performance of the device 100 receiving an RF signal modulated with a 1 KHz tone. Several deviation levels are shown on the graph 402 identifying the deviation level of the received signal. 402A, 402B, 402C, 402D, and 402E represent 1 KHz, 2 KHz 3 KHz, 4 KHz, and 5 KHz deviation, respectively. As can be seen, the deviation directly affects the correlation between the highband noise energy and the audio band energy. It is for this reason that the squelch threshold will have to be dynamically changed in order to determine the correct value with which the square and integrator output has to be compared. Graphs 404, 406, and 408 show the correlation of the highband noise energy versus the audio band energy for different SNRS. Note that the performance of the highband energy with respect to the audio band energy flattens as the SNR is improved. This is because of the non-linearity of the FM demodulation.

In the preferred embodiment, these curves are empirically collected. It is understood that theoretical collection of information will lead to similar curves. The curves 402, 404, 406, and 408 are stored in the code plug 107 and are referred to by the squelch circuit 120 upon demand. The squelch setting of the communication device 100 dictates which of the curves 402, 404, 406, and 408 shall be used in the establishment of the threshold. In other words, depending on the squelch attenuator setting as determined by the setting of the squelch, tight or threshold, a specific curve will be selected to establish the squelch threshold. The dynamic selection of the squelch threshold allows for a more accurate evaluation of the strength of the signal in the presence of noise leading to a more accurate squelch detection. It is understood that the determination of the squelch threshold is not limited to the four characterization curves presented in the preferred embodiment.

In the preferred embodiment, the squelch setting is set at the factory in the code plug 107. In other words, a certain location in the code plug 107 includes an attenuator setting number. Other alternatives use knobs to allow the user to vary the squelch setting manually. Regardless of the method used, one of the four SNR curves, 402, 404, 406, or 408 is selected by the DSP 110 and is available to the integrate and dump circuit 206. For discussion purposes the 12 db SNR curve 404 is selected as providing sufficient squelch protection. The signal energy as determined by the correlator 204 is located on the curve 404. The corresponding point on the vertical axis, the highband energy, determines a threshold. This threshold is used by the squelch decision circuit 214 for the evaluation of the high band energy content of the received signal.

The square and integrator 210 provides an analysis of a second segment of the frequency spectrum of the received signal, preferably the highband noise, to determine the energy components contained therein. The result of this analysis is sampled by a second integrate and dump sampler 212. The instantaneous value of the high band noise energy is compared with the squelch threshold at the squelch decision circuit 214. The result of this comparison determines whether to mute or unmute the audio gates 114. Hence, an output from the squelch decision circuit 214 is coupled to the control line of the audio gates 114. With the high band noise content below the dynamically established threshold, the audio gates 114 are unmuted allowing audio to reach the speaker 116 from the DAC 118. From this condition, the squelch decision circuit 214 periodically compares the high band noise with the threshold to determine changes in the squelch condition. A hysterisis is used to prevent squelch chatter.

Figure 5:
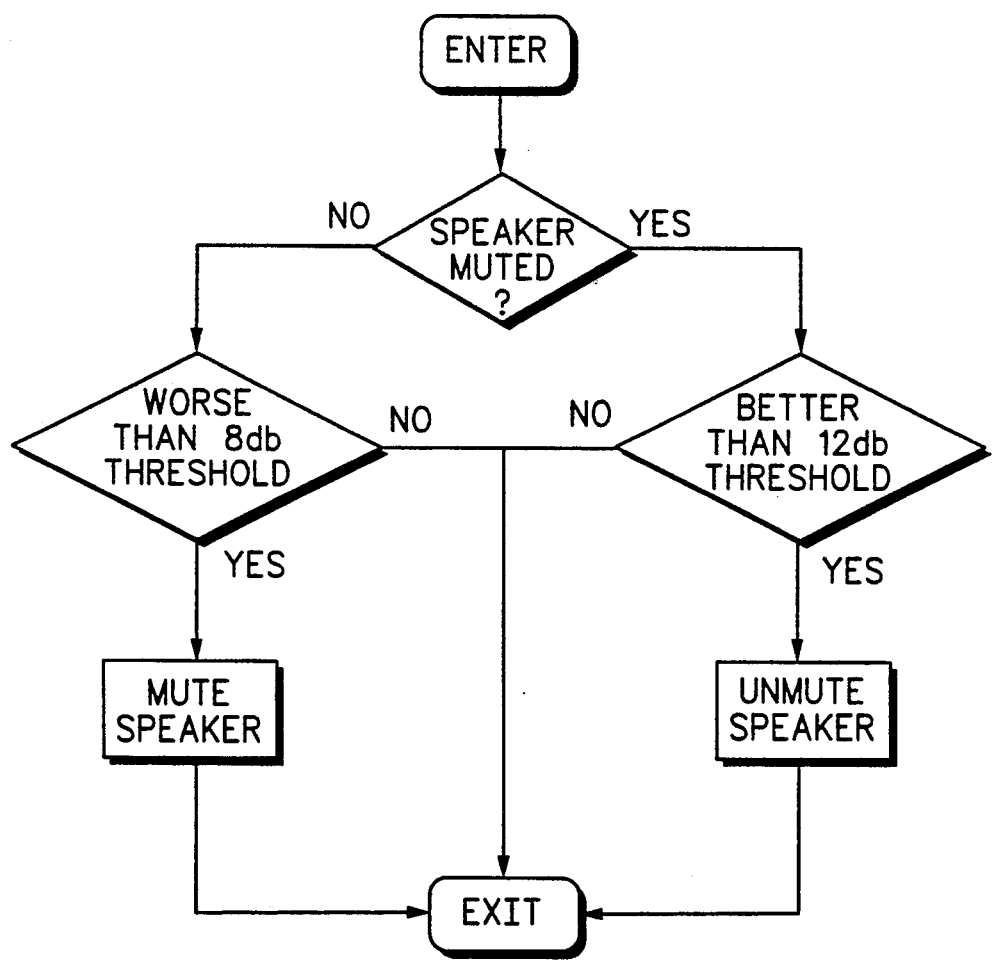
FIG. 5 is a hysterisis flow chart in accordance with the present invention.

FIG. 5 shows a flow chart of the hysterisis used in the preferred embodiment. It can be seen that by using the 8 db and 12 db thresholds a hysterisis of 4 db may be realized, significantly reducing squelch chatter.

Figure 3:
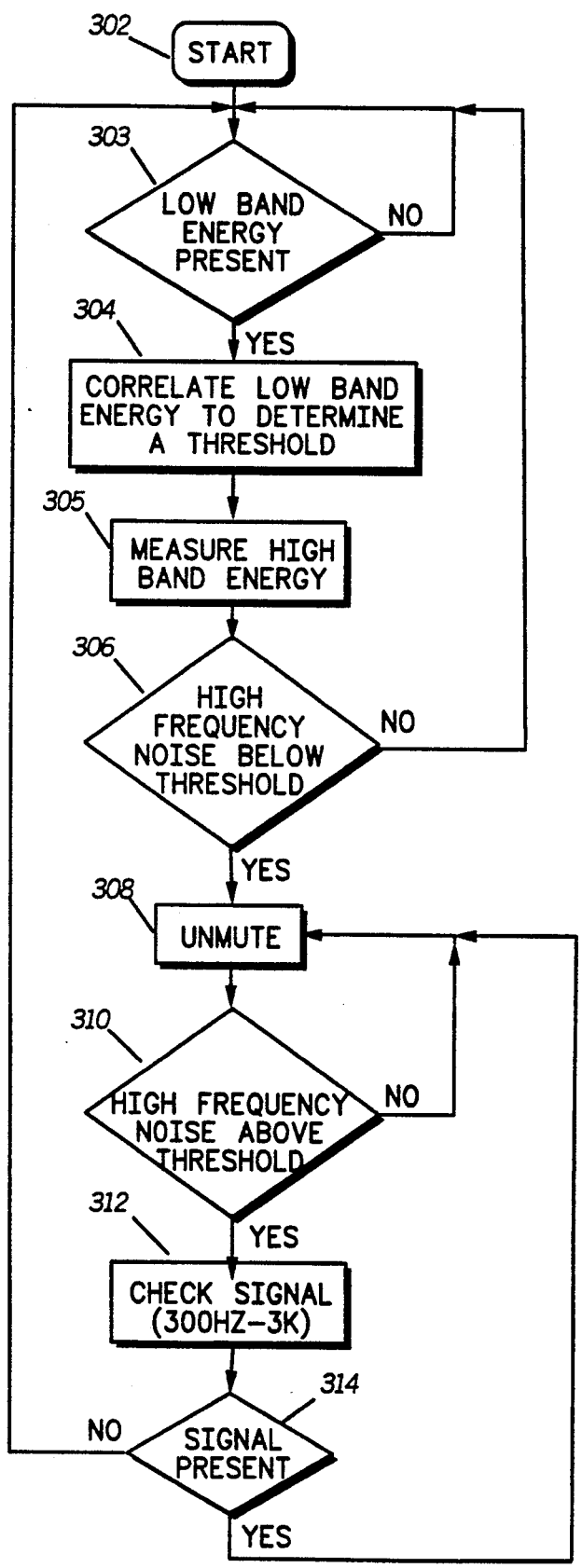
FIG. 3 shows a flow chart of the operation of the squelch circuit in accordance with the present invention.

A flow chart shown in FIG. 3 comprises a mechanism by which the squelch circuit 120 determines the state of the audio gates 114. From the start block 302, the received signal is checked and a decision is made as to the presence of low band energy, block 303. In the preferred embodiment, the presence of low band energy is checked by evaluating the signal energy in the 300 Hz to 3 KHz range. The NO output of the condition block 303 returns the operation back to the start block 302. The YES output is coupled to a block 304 where the low band energy is correlated to dynamically produce the squelch threshold. Next, the highband energy is measured, block 305. Following this block a decision is made as to whether the energy of the highband noise is below the threshold as dynamically determined by the correlator 204. The NO output indicating that a high level of highband noise is present returns the operation to the start block 302. This NO condition may be the result of temporary presence of noise components in the audio band analyzed by condition block 304. The YES output of the condition block 306 is coupled to a block 308 where the audio gates 114 are unmuted. The audio gates 114 remain unmuted until a further decision is made to the contrary. Once the audio gates 114 are unmuted, a condition block 310 determines if the highband noise has crept up above the threshold, or a hysterisis as the case may be. The NO output of the condition block 310 is coupled back to the block 308 where the audio gates 114 remain unmuted. The YES output indicating that the highband noise components of the received signal have gone beyond the squelch threshold, or a hysterisis thereof, is coupled to a block 312 where the low band energy content of the received signal is once again checked. Upon such analysis, a decision is made as to whether audio signal is present. The NO output of block 314 returns the operation to the start block 302 where the entire operation is repeated. The YES output indicating that the audio board signal is still present returns the operation to the unmute block 308. The YES output of the block 314 occurs as a result of what is known in the art as temporary fading, which occurs when the high frequency noise is temporarily increased without the audio having disappeared. Note that although the unmuting and muting of the audio gates 114 along with any desired hysterisis are accomplished via the squelch circuit 120 it is feasible to use a first component of the DSP 110 to unmute and a second component of the DSP 110 to mute the audio gates 114.

In summary, a squelch circuit and a method of unmuting a speaker is shown for use in a communication device used for the reception and transmission of digitized voice. The present invention utilizes the squelch circuit 120 of the DSP 110 which is used in the recovery of the digitized voice to determine whether the speaker 116 should be unmuted. Hence, the need for a dedicated squelch circuit is eliminated. By correlating the audio band segment of the frequency spectrum of the received signal, the correlator 204 dynamically adjusts the squelch threshold. This threshold is then used by the square and integrator 210 and the integrate and dump 212 in determining the level of the highband noise energy in the received signal. The squelch decision circuit 214 proceeds to monitor and analyze the highband noise of the received signal to determine the compression of noise which is concurrent with reception of valid signal in FM systems. By comparing the highband noise to the squelch threshold, the DSP 110 establishes that indeed a signal is being received and hence directs the audio 114 to unmute allowing the received audio to be heard on the speaker 116. A significant benefit of the present invention is that a dedicated squelch circuit is no longer needed in communication devices used for receiving digitized voice. In place of a dedicated squelch circuit, the DSP 110 is used to monitor different segments of the frequency spectrum of the received signal to unsquelch the communication device 100. The communication device 100 can now enjoy the same benefits of squelch systems used in non-digitized voice communication devices without the use of dedicated components, reducing cost, space, and parts count.

Another benefit of the present invention is that it limits current consumption by limiting the operating frequency of the DSP 110. In the preferred embodiment the bandwidth of the signal observed by the DSP 110 for the detection of squelch is limited to 10 KHz as compared to traditional 25 KHz bandwidth used in typical squelch circuits. The significant reduction in the bandwidth requirements is due to lack of limiters in the squelch path of the DSP 110. With no limiters in the squelch path the audio signal is not spread in frequency hence eliminating the need to monitor very high frequency portions of the received signal. In other words, the detection of highband energy is accomplished by monitoring the signal level below 10 KHz. Since the high frequency monitoring of the received signal is no longer necessary with this squelch detection, a lower clock frequency may be used with the DSP 110 lowering its consumption current.

What is claimed is:

1. A communication device having an audio output device, comprising:
   receiver means for receiving a signal to produce a received signal having a frequency spectrum;
   a first means having a correlator and integrator and dump means for measuring a signal energy level in a first segment of the frequency spectrum of the received signal to determine a threshold;
   second means for measuring a signal energy level in a second segment of the frequency spectrum of the received signal; and
   third means for unmuting the audio output device when the signal level measured by the second means is below the threshold.

2. The communication device of claim 1, wherein the first means includes means for measuring low band signal energy.

3. The communication device of claim 1, wherein the second means includes means for measuring high band signal energy.

4. The communication device of claim 1, wherein the first means includes a digital signal processor.

5. The communication device of claim 1, wherein the third means includes an audio gate.

6. The communication device of claim 1, wherein the threshold includes a hysterisis.

7. The communication device of claim 1, wherein the third means includes means for muting the audio output device when the signal level measured by the second means is above the threshold.

8. In a radio communication device having an audio output device, a method for preventing low quality voice signals from reaching the audio output device, comprising the steps of:
   receiving a radio frequency signal to produce a received signal having a frequency spectrum;
   correlating to a first frequency segment of the frequency spectrum of the received signal;
   deriving a signal energy level in the first frequency segment to produce a threshold;
   monitoring a second frequency segment of the frequency spectrum of the received signal;
   sensing when the signal energy in the second frequency segment of the received signal is below the threshold; and
   unmuting the audio output device in response to the signal energy in the second frequency segment being below the threshold.

9. The method of claim 8, wherein the first frequency segment includes low band audio.

10. The method of claim 8, wherein the second frequency segment includes high band noise.

11. The method of claim 8, further comprising the steps of:
    sensing when the signal energy in the second frequency segment of the received signal is above the threshold; and
    muting the audio output device in response to the signal energy in the second frequency segment being above the threshold.

12. A communication device having an audio output device, comprising:

receiver means for receiving a radio frequency signal modulated with a digitized voice signal, the radio frequency signal having a frequency spectrum;

processor means for recovering the digitized voice signal;

means for converting the digitized voice signal to an analog signal;

squelch means for sensing when to prevent the analog signal from reaching the audio output device, the squelch means comprising:
  a first means having a correlator integrator and dump means for measuring signal energy level in a first segment of the frequency spectrum of the received signal to establish a threshold;
  second means for measuring a signal energy level in a second segment of the frequency spectrum of the received signal; and
  third means for unmuting the audio output device when the signal level measured by the second means is below the threshold.

13. The communication device of claim 12, further including means for correcting errors in the digitized voice signal.

14. A communication device having a squelch setting and an audio output device, comprising:
  receiver means for receiving a radio frequency signal to produce a received signal;
  correlator means for correlating a first segment of the received signal to dynamically produce a threshold based on the squelch setting;
  means for comparing signal energy in a second segment with the threshold; and
  means for unmuting the audio output device when the signal energy level in the second segment is below the threshold.

15. The communication device of claim 14, wherein the means for comparing includes a "square and integrator" circuit.

16. The communication device of claim 14, wherein the means for comparing includes a digital signal processor.

17. The communication device of claim 14, wherein the threshold includes a hysterisis.

* * * * *